United States Patent [19]
Bruning

[11] Patent Number: 4,785,192
[45] Date of Patent: Nov. 15, 1988

[54] MAINTAINING OPTICAL SIGNALS IN PRESCRIBED ALIGNMENT WITH RESPECT TO WORKPIECE IN MOVABLE EQUIPMENT

[75] Inventor: John H. Bruning, Brookside, N.J.

[73] Assignee: American Telephone and Telegraph Company, AT&T Bell Laboratories, Murray Hill, N.J.

[21] Appl. No.: 60,876

[22] Filed: Jun. 12, 1987

Related U.S. Application Data

[60] Continuation of Ser. No. 862,475, May 12, 1986, Pat. No. 4,703,166, which is a division of Ser. No. 623,247, Jun. 21, 1984, abandoned.

[51] Int. Cl.⁴ ..................... G01N 21/86; G01V 9/04
[52] U.S. Cl. ..................... 250/548; 356/401
[58] Field of Search ............ 250/548, 557, 201; 356/400, 401; 219/121 LU, 121 LX

[56] References Cited

U.S. PATENT DOCUMENTS

| | | | |
|---|---|---|---|
| 4,311,389 | 1/1982 | Fay et al. | 356/400 |
| 4,333,044 | 6/1982 | Blitchington | 250/548 |
| 4,531,060 | 7/1985 | Suwa et al. | 250/557 |
| 4,577,113 | 3/1986 | Marantette et al. | 250/548 |
| 4,592,648 | 6/1986 | Tabarelli et al. | 356/401 |
| 4,617,469 | 10/1986 | Takahashi et al. | 250/557 |
| 4,677,301 | 6/1987 | Tanimoto et al. | 250/548 |

Primary Examiner—David C. Nelms
Assistant Examiner—William L. Oen
Attorney, Agent, or Firm—Lucian C. Canepa; Bernard Tiegerman

[57] ABSTRACT

A deep-UV step-and-repeat photolithography system includes a narrow-bandwidth pulsed excimer laser illumination source and an all-fused-silica lens assembly. The system is capable of line definition at the 0.5-micrometer level. One significant feature of the system is its ability to perform wafer focus tracking by simply changing the frequency of the laser.

13 Claims, 3 Drawing Sheets

MAINTAINING OPTICAL SIGNALS IN PRESCRIBED ALIGNMENT WITH RESPECT TO WORKPIECE IN MOVABLE EQUIPMENT

This is a continuation of application Ser. No. 862,475 filed May 12, 1986, which is a division of application Ser. No. 623,247, filed June 21, 1984, now abandoned.

BACKGROUND OF THE INVENTION

This invention relates to optical lithography and, more particularly, to apparatus and methods for achieving short-wavelength optical lightography adapted for fabricating high-quality fine-line semiconductor devices.

As feature sizes on semiconductor integrated circuit devices approach one micrometer (micron) and below, extensive efforts are being directed at developing lithographic equipment capable of pattern delineation at these dimensions. Electron-beam, ion-beam and X-ray lithography have demonstrated patterning capabilities that extend into the submicron-like region. But workers in the art have recognized that there are obvious incentives for also trying to push the currently dominant technology (optical lithography) into this fine-line region. Such an effort, if successful, would have the potential of providing a basis for retrofitting or modifying expensive existing equipment to give it significantly better patterning capabilities.

It is known that the resolution limit ($L_{min}$) for equal lines and spaces in an optical imaging system can be expressed as $$L_{min} = K\lambda/NA \quad (1)$$

where K is a constant whose value is typically between 0.4 and 1.0 depending on processing and illumination conditions and resist characteristics, $\lambda$ is the wavelength of the exposing radiation and NA is the numerical aperture of the projection optics.

It is apparent from (1) that the minimum printable feature can be reduced by decreasing $\lambda$ or by increasing NA. But, since the depth of focus of the system varies inversely as $(NA)^2$, it is usually preferable in a practical high-resolution system to achieve the desired $L_{min}$ by reducing $\lambda$ rather than increasing NA.

Accordingly, wide interest exists in optical lithography at wavelengths below the conventional 4000 Angstrom unit (A) region. It was recognized that systems operating in this region (which includes the so-called deep-ultraviolet or deep-UV portion of the electromagnetic spectrum) would have the potential for patterning extremely fine lines (for example, 0.5—micron lines). Moreover, it was recognized that such a high-resolution system, if employed in an application where submicron lines are not needed in practice, would have the capability to be adjusted to exhibit an advantageously large depth-of-focus characteristic for patterning coarser lines. For these and other reasons, the development of short-wavelength (for example, deep-UV) lithography is viewed as an important step in the realization of high-quality fine-line integrated circuit devices.

SUMMARY OF THE INVENTION

Hence, an object of the present invention is to improve optical lithography. More specifically, an object of this invention is to provide apparatus and methods for achieving short-wavelength high-throughput optical lithography adapted for fabricating high-quality fine-line semiconductor devices.

Briefly, these and other objects of the present invention are realized in a specific illustrative step-and-repeat system embodiment thereof that includes a narrow-bandwidth tunable laser operating at a wavelength in the deep-UV range. A monochromatic all-fused-silica lens assembly is utilized to direct the output of the laser to successive specified portions of the surface of a resist-coated wafer mounted on a stepping table.

The combination of a narrow-bandwidth laser and a monochromatic lens assembly in accordance with the invention makes it possible to quickly and easily accomplish focus tracking in the system. This is done simply by changing the wavelength of the laser by means of a computer-controlled feedback control loop. Additionally, the loop provides an instrumentality by which to achieve and maintain a highly stable laser output at the wavelength that is best matched to the lens assembly.

The aforementioned focus tracking technique involves directing the output of a laser onto the surface of a workpiece via a projection lens and controlling the wavelength of the laser to maintain the focal length of the lens equal to the lens-to-workpiece surface spacing.

Advantageously, the laser and associated components are physically separated from the movable vibration-isolated remainder of the stepping system. To maintain accurate alignment between the laser beam and the remainder of the system, a unique tracking arrangement is utilized to consistently aim the beam at a specified portion of the projection lens of the system. Further, by means of the tracking arrangement, the beam can be scanned over a field stop to accomplish area averaging, which increases the uniformity of illumination in the system.

In further accord with the principles of the present invention, applicant's system includes a two-dimensional scanner for converting the extremely high-brightness laser beam into a relatively large effective source. In turn, the large source is relayed to fill a sufficiently large portion of the entrance pupil of the projection lens to insure good imaging characteristics on the wafer surface. By means of the scanner, both the size and shape of the effective source can be selectively varied.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
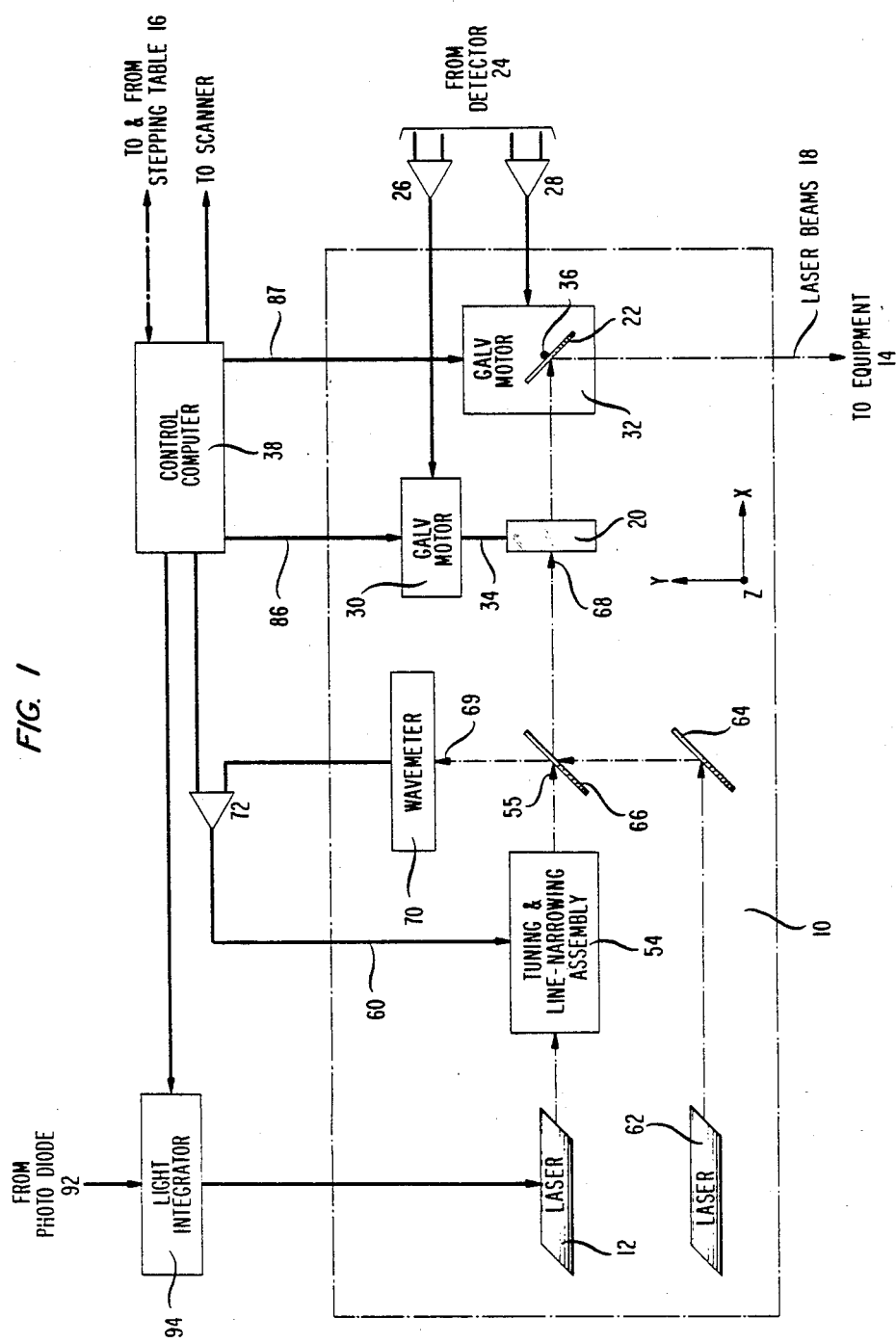
FIGS. 1 and 2 taken together schematically depict a specific illustrative apparatus made in accordance with the invention for achieving short-wavelength optical lithography.

In accordance with one feature of the principles of applicant's invention, a laser illumination source for step-and-repeat optical lithography is physically separated from the movable table portion of the system. Thus, for example, the equipment 10 including laser 12 shown in FIG. 1 is advantageously located at a site removed from the equipment 14 including stepping table 16 shown in FIG. 2. In this arrangement, the laser beam provided by the equipment 10 is propagated through air or controlled space to the equipment 14, as indicated by arrow 18 in FIG. 1. (Actually, as will be clear later below, two coaxially disposed laser beams are transmitted from the equipment 10 in the direction of the arrow 18. One beam constitutes the exposing radiation. The other beam is utilized only for alignment control purposes.)

There are several reasons for physically separating the aforementioned equipments 10 and 14. In some cases (for example in the particular illustrative case specified laser below), the laser 12 shown in FIG. 1 includes a toxic constituent which for safety considerations should be located at a site remote from where operating personnel are located. In that way, if leakage of the toxic constituent should occur, the likelihood of harm to personnel is minimized. Further, for high-precision lithography, the equipment 14 should be mounted in as vibration-isolated a manner as possible. And, since the equipment 10 typically includes cooling and circulating fans, it is important to physically separate the equipment 10 from the equipment 14 to minimize the coupling therebetween of mechanical vibrations and thermal transients.

The vibration-isolated equipment 14 (FIG. 2) typically freely floats on air suspensions, in a manner known in the art. Accordingly, when the stepping table 16 moves, the entire equipment 14 is set in motion. But the physically separated and stationary equipment 10 remains relatively still. Thus, maintaining accurate alignment of the laser beams 18 emanating from the equipment 10 relative to a specified location of the equipment 14 poses a considerable challenge.

In accordance with a feature of the present invention, instrumentalities are provided in the equipments 10 and 14 for consistently maintaining the laser beams 18 aligned relative to the movable equipment 14. Illustratively, these instrumentalities include standard driven galvanometer mirrors 20 and 22 in the equipment 10 and a conventional quadrant photodetector or position-sensitive photodetector 24 mounted on the equipment 14. Electrical signals provided by the array 24 are applied to differential amplifiers 26 and 28 in feedback loops that respectively control galvanometer motors 30 and 32. The motor 30 is mechanically coupled to the mirror 20 via a Y-axis-parallel shaft 34, and the motor 32 is coupled to the mirror 22 via a Z-axis-parallel shaft 36. By selective rotation of the mirrors 20 and 22, the orientation of the laser beams 18 emanating from the equipment 10 is varied in a controlled manner to compensate for movement of the equipment 14. In that way, the desired orientation of the beams relative to the moving equipment 14 is maintained substantially invariant.

Under quiescent conditions, the desired orientation of the laser beams 18 relative to the equipment 14 is established by steady-state signals applied to the galvanometer motors 30 and 32 from a control computer 38. The additional variable signals supplied by the differential amplifiers 26 and 28 to the motors 30 and 32 are superimposed on the steady-state signals supplied by the computer.

Figure 2:
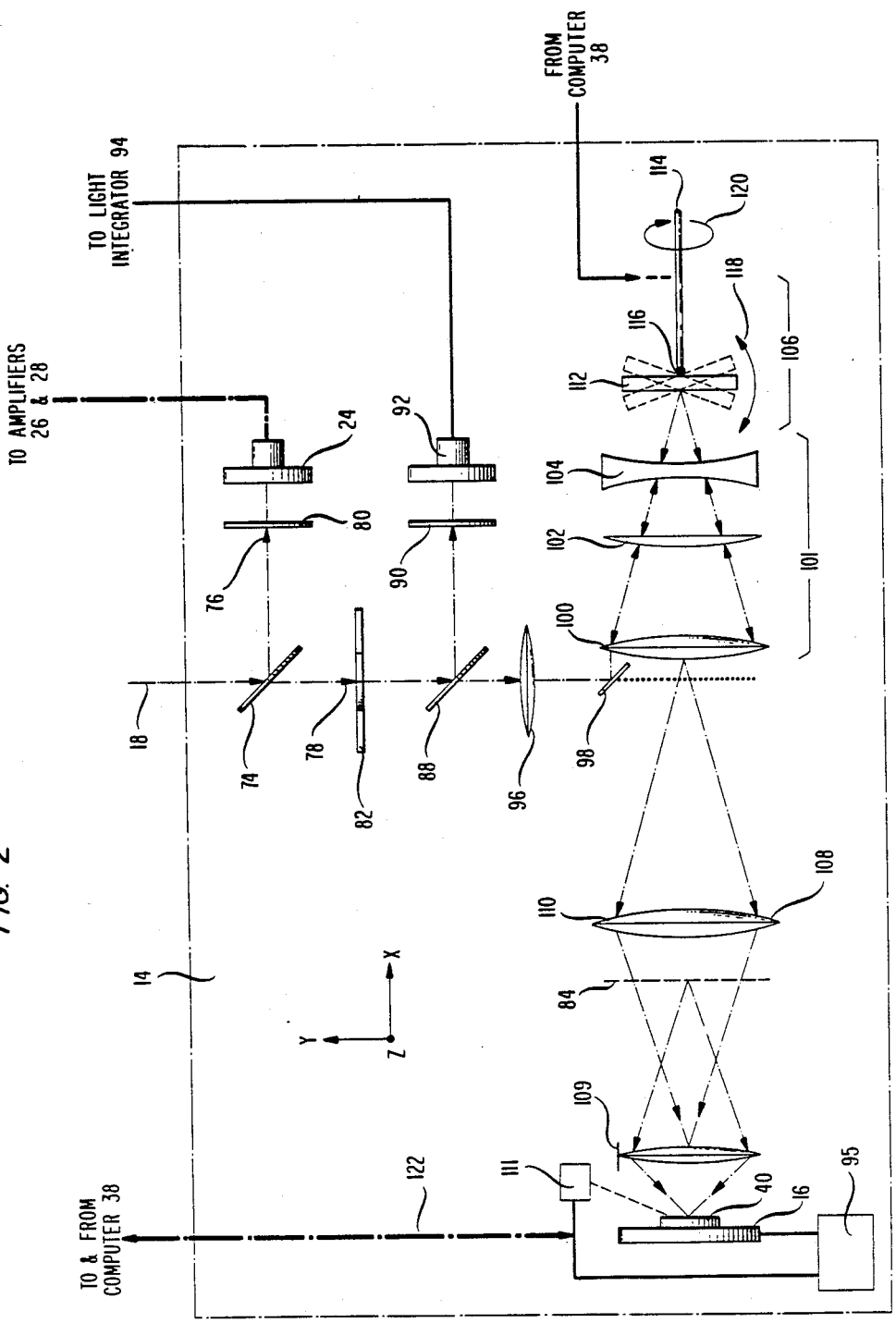

In accordance with another feature of the principles of the present invention, the aforedescribed instrumentalities for maintaining a prescribed alignment of the laser beams 18 relative to the equipment 14 also provide a basis for achieving improved uniformity of illumination of resist-coated wafer 40 supported on the stepping table 16 (FIG. 2). This additional capability, which is important for achieving good linewidth control on the wafer, will be described in detail later below.

In accordance with still another feature of applicant's invention, each of the lenses included in the equipment 14 of FIG. 2 is made only of fused silica. This is advantageous because fused silica is the preferred material from which to make lenses designed to operate in short-wavelength regions such as the deep-UV region. Fused silica is a highly stable material that is highly transparent to light at these wavelengths. Moreover, fused silica can be fabricated with good precision to form specified lens designs. Despite these apparent advantages, applicant is the first to have proposed the use of a single optical material (fused silica) to make a high-quality lens assembly for short-wavelength (for example, deep-UV) optical lithography based on laser illumination. Heretofore, it has been customary to fabricate lenses utilizing multiple materials to correct the chromatic aberrations.

Once he designed an all-fused-silica lens assembly, applicant recognized that a laser source to be combined with the assembly must as a practical matter have an extremely narrow bandwidth if chromatic aberrations in the single-optical-material assembly were to be avoided. Since chromatic aberrations are unavoidable with a single-optical-material design, if the laser source bandwidth is not suitably narrow, the projected image on the laser-beam-illuminated wafer 40 (FIG. 2) would be unacceptably blurred.

But applicant found that all suitable short-wavelength laser sources of adequate power were pulsed lasers that inherently exhibit excessively broad bandwidths. At that point, the obvious thing to have done, as other workers in the art have, would have been to redesign the lens assembly to be free of chromatic aberrations with the available source bandwidths. But this would have entailed employing optical materials other than only fused silica. Instead, applicant embarked on the unobvious course of retaining an all-fused-silica lens design and redesigning the laser source to exhibit an appropriately narrow bandwidth. This unique approach allows the realization of a superior lens design and, moreover, is the basis for achieving electronic focus tracking as well as for achieving electronic tuning of the laser source. Such tuning allows the source to be matched to the operating characteristics of the lens assembly, as will be specified in detail later below.

Illustratively, the laser 12 included in the equipment 10 of FIG. 1 comprises an excimer laser. This category of lasers is well known in the art to be capable of UV emission at specific wavelengths from, for example, below 4000 Å to below 2000 Å.

Excimer lasers and their application to lithography are described in a number of publications. These include: "Laser Projection Printing" by G. M. Dubroeucq et al. Proceedings of Microcircuit Engineering Conference, Aachen, Germany, September 1979, pages 328–337; "Applications of Excimer Lasers in Microelectronics" by T. McGrath, Solid State Technology, December 1983, pages 165–169; "Deep UV Exposure of $Ag_2Se/GeSe_2$ Utilizing an Excimer Laser" by K. J. Polasko et al, *IEEE Electron Device Letters*, Vol. EDL-5, No. 1, January 1984, pages 24–26; and "Excimer Laser Projection Lithography" by K. Jain et al, Applied Optics, Vol. 23, No. 5, Mar. 1, 1984, pages 648–650.

By way of a specific example, the laser 12 of FIG. 1 comprises a pulsed KrF gas excimer laser designed to operate a nominal center wavelength of 2484 Å. (The fluorine constituent in KrF is highly toxic.) Illustratively, the pulse repetition rate of the laser 12 is selected to be approximately 1000 pulses per second.

Inherently, the KrF excimer laser 12 (FIG. 1) has a spectral linewidth at the half-power point of approximately 10 Å. But, recognizing that an all-fused-silica lens assembly for high-resolution lithography requires a source linewidth of less than about 0.1 Å to be free of chromatic aberrations, applicant combined a line-narrowing assembly with the laser 12 to achieve an output at 2484 Å characterized by a half-power-point linewidth of only approximately 0.05 Å. At a repetition rate of 1000 pulses per second, the power of each such pulse is about 5 millijoules, which characteristics provide an adequate basis for uniform high-resolution high-throughput lithography.

Various techniques are available for narrowing the inherent linewidth of the laser 12. One suitable assembly for doing this, combined with a schematic depiction of a portion of the laser itself, is represented in FIG. 3.

Figure 3:
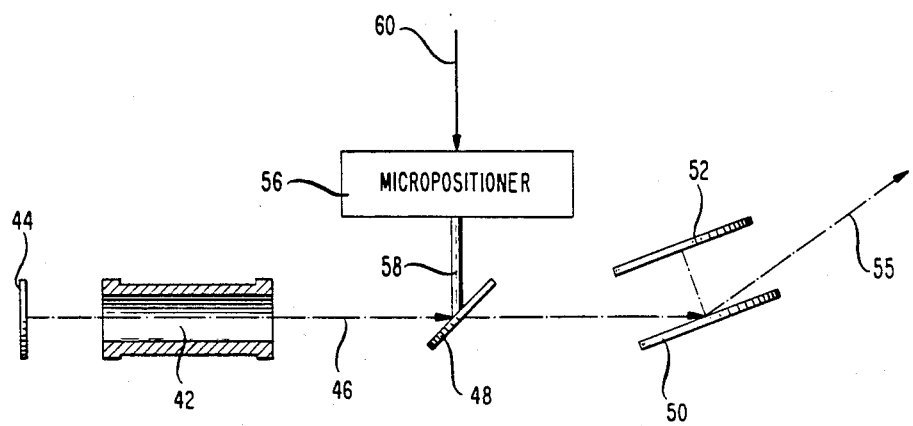
FIG. 3 shows in more detail a particular implementation of a portion of FIG. 1.

The portion of the laser 12 depicted in FIG. 3 comprises a gain medium 42 and a high-reflectivity mirror 44. Beam 46 emanating from the laser propagates through a standard low-finesse etalon 48 and impinges upon a conventional grazing-incidence grating 50 which is spaced apart from a facing high-reflectivity mirror 52. Illustratively, the grating 50 has 3000-to-4000 grooves per millimeter. The elements 48, 50 and 52 constitute a tuning and line-narrowing assembly. This assembly is shown in FIG. 1 and identified therein by reference numeral 54.

The desired narrow-bandwidth output emanating from assembly 54 constitutes the zero-order energy coupled out from the grating 50. This mode propagates in the direction indicated by arrow 55 in FIG. 3. The arrow 55 is also shown in FIG. 1 wherein it is oriented parallel to the X axis.

Establishing the cneter wavelength of the laser output 55 at a predetermined value and thereafter precisely maintaining the wavelength at that value (or purposely moving the wavelength off that value to accomplish electronic focus tracking) can be done in a variety of ways. Illustratively, this is accomplished by rotating any one or combination of the elements 48, 50 and 52 about an axis perpendicular to the plane of the paper on which FIG. 3 is drawn. For coarse tuning, rotating the mirror 52 and/or the grating 50 is satisfactory. For fine tuning, rotating only the etalon 48 is effective. In practice, it is usually advantageous to initially establish the predetermined center wavelength by rotating one or both of the elements 50 and 52. Thereafter, the laser can be maintained at that wavelength or fine-tuned therefrom by selectively controlling the orientation of only the etalon 48.

As schematically indicated in FIG. 3, a micropositioner 56 is connected via a mechanical coupler 58 to the etalon 48. In response to signals applied to the micropositioner 56 on line 60, the orientation of the etalon is thereby controlled to maintain the wavelength of the laser beam 55 at a predetermined value or to move the wavelength off that value by a specified amount to accomplish electronic focus tracking. The manner in which the microposition 56 is so controlled will be described in detail later below.

Various instrumentalities are known in the art for tuning and line-narrowing the output of a short-wavelength laser in the general manner carried out by the aforespecified assembly 54. In this connection, see, for example: "Injection-Locked, Narrow-Band KrF Discharge Laser Using an Unstable Resonator Cavity" by J. Goldhar et al, *Optics Letters*, Vol. 1, No. 6, December 1977, pp. 199–201; "Operating and Beam Characteristics, Including Spectral Narrowing, of a TEA Rare-Gas Halide Excimer Laser" by T. J. McKee et al, *IEEE Journal of Quantum Electronics*, Vol. QE-15, No. 5, May 1979, pp. 332–334; "Grazing Angle Tuner for CW Lasers" by K. R. German, *Applied Optics*, Vol. 20, No. 18, September 15, 1981, pp. 3168–3171; and "A Simple Tunable KrF Laser System with Narrow Bandwidth and Diffraction-Limited Divergence" by R. G. Caro et al, *Journal Physics D: Applied Physics*, 15, 1982, pp. 767–773.

The aforedescribed feedback loops for controlling the galvanometer motors 30 and 32 (FIG. 1) require continuous electrical signals therein. But the pulsed laser 12 is not capable of providing such signals via the detector 24 (FIG. 2). Hence, a continuous-wave (CW) laser 62 (for example, a standard helium-neon laser operating at 6328 Å) is also included in the equipment 10. The laser 62 is designed to provide a continuous reference beam that is coaxial with the aforespecified beam at 2484 Å. In turn, the beam at 6328 Å is converted by the detector 24 into continuous electrical signals that are applied to the feedback loops that respectively control the galvanometer motors 30 and 32.

Whenever the detectors 24 senses that the reference beam at 6328 Å is off-center relative to its prescribed alignment with the detector 24, correction signals are applied to the motor 30 and/or to the motor 32 to re-establish the prescribed alignment. And, since the beams at 6328 Å and 2484 Å are propagated coaxially in the equipment 10, these correction signals are effective to re-establish the prescribed alignment of the exposing beam at 2484 Å.

The output of the CW laser 62 (FIG. 1) is directed via a high-reflectivity mirror 64 to a dichroic mirror 66. The mirror 66 is designed to reflect the incident beam at 6328 Å to the right along an X-direction path indicated by arrow 68. The mirror 66 is also designed to transmit most of the incident beam at 2484 Å emanating from the assembly 54 along the same X-direction path. Thus, the arrow 68 indicates the path along which the CW beam at 6328 Å and the pulsed beam at 2484 Å propagate coaxially to successively impinge upon the galvanometer mirrors 20 and 22. After reflection from the mirrors 20 and 22, the coaxial beams are propagated from the equipment 10. These coaxial beams constitute the previously specified beams 18.

A small portion (for example, about one percent) of the beam at 2484 Å emanating from the assembly 54 of FIG. 1 is reflected upward by the mirror 66 along a Y-direction path indicated by arrow 69 to a wavemeter 70. In response thereto, the wavemeter 70 provides an electrical signal to one input of a differential amplifier 72. The other input to the amplifier 72 is supplied by the control computer 38. In that way, the output of the amplifier 72 applied to the lead 60 is effective to maintain the output of the assembly 54 at a predetermined center wavelength specified by the computer 38. Or, as will be described in more detail later below, the signal applied to the amplifier 72 by the computer 38 can also be utilized to purposely change the center wavelength to achieve electronic focus tracking.

Further, the aforespecified ability of the computer 38 (FIG. 1) to easily control or adjust the center wavelength of the beam emanating from the assembly 54 simplifies the overall design and fabrication of the equipment described herein. This is so because in practice one can rarely make an all-fused-silica lens assembly precisely to a specified prescription. Normally, one would have to install the fabricated lens assembly in the equipment, test the assembly at a prespecified center frequency, and then take the assembly apart to make adjustments therein by further machining, polishing, etc.

Subsequently, re-installation of the lens assembly and further testing in the equipment would be done, and so forth in an interactive fashion until a near-optimal match between the lens assembly and the center wavelength was obtained. Such mechanical tuning or matching of the lens assembly to a fixed prespecified center wavelength is obviously time-consuming and expensive.

By contrast, in applicant's unique design, it is often possible, after initially installing the all-fused-silica lens assembly in the herein-described equipment, to achieve a near-ideal adjustment of the equipment without removing the lens assembly. This is done by leaving the installed assembly intact and adjusting the center wavelength of the exposing beam, under control of the computer 38, to obtain a near-optimal match between the operating characteristics of the lens assembly as initially fabricated and the operating wavelength of the equipment. Such electronic, rather than mechanical, adjustment of the equipment is manifestly advantageous.

The laser beams at 2484 Å and 6328 Å that emanate from the equipment 10 in the direction of arrow 18 are directed at the equipment 14 shown in FIG. 2. In particular, these beams are directed at a mirror 74 in the equipment 14. The mirror 74 is designed to be highly reflective at 6328 Å and highly transmissive at 2484 Å. As a result, most of the 6328 Å beam is directed to the right in the direction of arrow 76 and most of the 2848 Å beam is directed downward in the direction of arrow 78.

The 6328 Å beam propagated in the direction of the arrow 76 in FIG. 2 passes through a filter 80. The filter 80 is designed to pass the 6328 Å beam but to block any portion of the 2484 Å beam that was reflected by the mirror 74 in the direction of the arrow 76. Accordingly, only the CW beam at 6328 Å impinges upon the detector 24. In turn, as described earlier above, the detector 24 provides continuous electrical signals in the feedback loops shown in FIG. 1 to control the operation of the galvanometer motors 30 and 32. In that way, the orientation of the 6328 Å beam relative to the equipment 14, and thus also the orientation of the coaxially disposed 2484 Å exposing beam, are maintained fixed even during vibratory motion of the equipment 14.

The 2484 Å beam propagated downward in FIG. 2 in the direction of the arrow 78 is directed at an adjustable field stop or aperture 82. Advantageously, the stop 82 is positioned to be in a conjugate relationship with a reticle 84 included in the equipment 14. Illustratively, the diameter of the beam at the stop 82 is designed to be larger than the diameter of the opening in the stop.

In practice, the equal-intensity contour lines of the 2484 Å beam transmitted through the stop 82 of FIG. 2 are not symmetrically disposed with respect to the opening in the stop. Moreover, this asymmetry tends to vary from pulse to pulse. if not compensated for, these factors can result in unsatisfactory illumination uniformity and consequent poor linewidth control at the surface of the wafer 40.

In accordance with a feature of the principles of the present invention, the slightly oversize beam directed at the stop 82 is dithered or moved systematically by small amounts $\Delta X$ and $\Delta Z$. For an exposure that comprises, for example, several hundred successive laser pulses, such movement is effective in practice to accomplish area averaging of the pulses transmitted throguh the stop 82. In turn, this results in better illumination uniformity at the surface of the wafer 40.

Movement of the 2484 Å beam directed at the stop 82 (FIG. 2) to carry out area averaging is controlled by the computer 38 (FIG. 1). Signals applied by the computer 38 via leads 86 and 87 to the galvanometer motors 30 and 32, respectively, are effective to implement the aforementioned $\Delta$ and $\Delta X$ movements of the beam across the aperture in the stop 82.

The 2484 Å beam that passes through the stop 82 impinges upon a mirror 88 shown in FIG. 2. This mirror is designed to reflect a relatively small amount (for example about one percent) of the incident beam. In turn, the reflected portion is directed through a filter 90 to a photodiode 92. The filter 90 is designed to pass light at 2484 Å but to block light at 6328 Å. In that way, any 6328 Å component in the block transmitted by the stop 82 is prevented from impinging on the photodiode 92.

The photodiode 92 of FIG. 2 constitutes part of a dose control and laser trigger arrangement. The photodiode 92 samples a portion of each 2484 Å pulse and, in response thereto, generates an electrical signal that is applied to a light integrator 94 (FIG. 1). The control computer 38 supplies a second input signal (a dose control signal) to the light integrator 94. In turn, the output of the integrator 94 is applied to the laser 12 as a trigger signal therefor.

A typical cycle of operation will illustrate the manner in which the aforementioned dose control and laser trigger arrangement functions. Under computer control, the stepping table 16 is moved by a micropositioner 95 to bring a chip site on the resistcoated wafer 40 into position for exposure to the pattern contained on the reticle 84. (Illustratively, the reticle is assumed to contain a single chip pattern thereon.) The computer 38 then activates the integrator 94 to trigger the laser 12 to start emitting pulses at 2848 Å. A portion of each pulse is sampled by the photodiode 92 and a signal representative thereof is applied to the integrator 94. When the integrator 94 detects that the prescribed dose set by the computer 38 has been attained, the laser 12 is signaled to cease emitting pulses. Subsequently, the table 16 is moved to position another chip site on the wafer 40 in position for the next exposure.

As indicated in FIG. 2, the 2484 Å beam that is transmitted through the mirror 88 is directed toward a collimating lens 96. The lens 96 serves to focus the beam to a small spot and to direct it at a mirror or prism element 98. The element 98 is designed to deflect the beam into the edge of the field of a scanning lens assembly 101 represented here by field lens 100 and additional lens elements 102 and 104. In turn, the beam is reflected by a scanning mirror assembly 106 back into the scanning lens assembly 101, as will be described in more detail later below.

The small laser spot formed by the lens 96 constitutes a virtual source for illumination of projection lens 108. By way of example, a one-to-one relay or condenser lens 110 is interposed between the virtual-source spot and the lens 108.

To achieve adequate illumination of the entrance pupil of the projection lens 108 and hence proper imaging characteristics on the wafer 40, it is advantageous to illuminate about 50-to-75 percent of the diameter of the entrance pupil of the lens 108. Illustratively, the entrance pupil of the lens 108 as defined by an aperture stop 109 is approximately 100 millimeters in diameter. It is apparent, therefore, that simply relaying the small virtual source to the lens 108 will not in practice provide adequate illumination of the entrance pupil of the lens 108.

In accordance with the principles of the present invention, the effective size of the virtual source that is relayed to the projection lens 108 is substantially increased in size. This is done by means of the scanning lens assembly 101 and the scanning mirror assembly 106. By means of these assemblies, both the size and shape of the effective virtual source can be selectively varied under control of signals applied to the assembly 106 from the computer 38. Significantly, in the course of making such variations, no laser light at 2484 Å is wasted in the depicted equipment. Hence, all available exposing light is delivered to the source of the wafer 40 even as changes are made in the size and shape of the illumination relayed to the entrance pupil of the projection lens 108.

In some applications, the ability to change both the size and shape of the illuminated portion of the entrance pupil of the projection lens 108 is significant. This permits, for example, tailoring the illumination to optimize resolution of certain critical features on the wafer 40 and to take maximum advantage of any nonlinearities in the characteristics of the resist layer on the wafer 40.

The scanning mirror assembly 106 schematically depicted in FIG. 2 comprises a mirror 112 and two independently rotatable shafts 114 and 116. The shaft 114 is oriented parallel to the X axis, whereas the shaft 116 is oriented perpendicular to the X axis. Rotation back and forth of the shaft 116 causes the mirror 112 to rock back and forth, as indicated by double-headed arrow 118. At the same time that rocking occurs, the shaft 114 is turning, as indicated by arrow 120. In other words, as the mirror rocks in response to rotation of the shaft 116, the rocking mirror is independently rotated by the shaft 114. As a consequence, a relatively large area in a Y-Z plane immediately to the left of the lens 100 can be substantially filled with the successive pulses supplied by the laser 12 of FIG. 1 to form a large-area virtual source. Illustratively, several hundred successive pulses are supplied by the laser 12 during each interval in which a chip site on the wafer 40 is being exposed.

The size of the aforespecified large-area virtual source can be changed by varying the extent to which the mirror 112 is rocked by the shaft 116. Additionally, the shape of the virtual source can be changed by varying the speed of rotation of the shaft 114 while the mirror 112 is being rocked.

Light emanating from the relatively large-area virtual source formed to the left of the lens 100 (FIG. 2) is directed by the relay lens 110 to illuminate the pattern contained on the reticle 84. In turn, light propagated through the reticle 84 is imaged by the lens 108 onto a chip site on the surface of the wafer 40. Illustratively, the lens 108 forms a reduced (for example 5-to-1 reduced) version of the reticle pattern on the wafer surface.

Advantageously, the opening in the stop 109 (FIG. 2) included in the projection lens 108 is adjustable. In that way, the numerical aperture of the depicted system can be changed. A variable depth-of-focus characteristic relative to the surface of the wafer 40 is thereby obtained. In practice, the numerical aperture is usually made as small as possible consistent with the line resolution requirements of the equipment.

In a standard exposure system, conventional focus tracking is accomplished by mechanically changing the projection lens-to-wafer distance. Typically, this is done either by moving the optical column of the system or by moving the wafer. In either case, the adjustment is time-consuming and, moreover, may cause undesirable mechanical resonances in the system.

In accordance with the principles of the present invention, focus tracking is carried out quickly in an advantageous nonmechanical manner. The ability to do so stems from the fact that applicant's equipment includes lenses made from a single optical material. Such lenses, unlike those corrected for chromatic aberrations, exhibit an approximately linear relationship between wavelength and focal distance. Hence, by electronically changing the wavelength of the laser 12 (FIG. 1), the focal plane of the projection lens 108 (FIG. 2) is also changed.

The mode of operation of applicant's unique focus tracking arrangement is as follows. First, a standard focus sensor 111 detects whether or not the distance between the projection lens 108 and the surface of the wafer 40 has changed from a prespecified value. Assume, for example, that that distance has changed (decreased) by one micron, due, for example, to warpage in the wafer 40. A signal representative of the change is then sent to the computer 38 via lead 122. In response thereto, the computer applies a corresponding correction signal to the differential amplifier 72 (FIG. 1) included in the aforedescribed frequency control loop. In turn, a signal is applied by the amplifier 72 to the tuning and line-narrowing assembly 54 to increase the center wavelength of the pulses emanating from the assembly 54. In one specific illustrative case, the center wavelength was increased by 0.1 Å. This was sufficient to decrease the focal distance of the lens 108 by one micron, thereby to compensate exactly for the assumed one-micron decrease in the lens-to-wafer spacing.

Finally, it is to be understood that the above-described arrangements and techniques are only illustrative of the principles of the present invention. In accordance with these principles, numerous modifications and alternatives may be devised by those skilled in the art without departing from the spirit and scope of the invention.

What is claimed is:

1. An optical system, comprising:
    a source of electromagnetic radiation;
    equipment, including apparatus adapted to support a workpiece, said apparatus being physically separated from said source and said equipment being characterized by an axis which is nonparallel to a surface of said apparatus;
    directing means for directing at least a portion of the radiation emitted by said source to said workpiece, said directing means including aligning means for maintaining a desired alignment between the directed radiation and said axis even during relative motion between said source and said equipment.

2. The optical system of claim 1 wherein said apparatus includes a stepping table.

3. The optical system of claim 1 wherein said source is capable of emitting radiation which includes deep UV radiation.

4. The optical system of claim 1 wherein said source includes a laser.

5. The optical system of claim 4 wherein said laser is an excimer laser.

6. The optical system of claim 5 wherein said excimer laser is a KrF excimer laser.

7. The optical system of claim 1 wherein said directing means includes a projection lens capable of optical communication with said source and said workpiece.

8. The optical system of claim 1 wherein said directing means includes a mirror capable of optical communication with said source and said workpiece, said alignment means including orienting means for altering an orientation of said mirror relative to said source in response to a deviation from said desired alignment.

9. The optical system of claim 8 wherein said orienting means includes a galvanometer motor mechanically connected to said mirror.

10. A method for fabricating a device, comprising the steps of:

mounting a workpiece on an apparatus adapted to support such a workpiece, said apparatus constituting a component of equipment characterized by an axis which is transverse to a surface of said apparatus;

directing electromagnetic radiation from a source of such radiation to said workpiece, said source being physically separated from said apparatus;

maintaining a desired alignment between said directed radiation and said axis even during relative motion between said source and said equipment; an further processing said workpiece to complete the fabrication of said device.

11. The method of claim 10 wherein said workpiece includes a substrate bearing photosensitive material.

12. The method of claim 11 wherein said substrate includes semiconductor material.

13. The method of claim 10 wherein said radiation includes deep UV radiation.

* * * * *

UNITED STATES PATENT AND TRADEMARK OFFICE
CERTIFICATE OF CORRECTION

PATENT NO. : 4,785,192

DATED : November 15, 1988

INVENTOR(S) : John Henry Bruning

It is certified that error appears in the above-identified patent and that said Letters Patent is hereby corrected as shown below:

Column 1, line 49, "A" should read --$\overset{o}{A}$--.
Column 5, line 63, "microposition" should read --micropositioner--.
Column 8, line 7, "throguh" should read --through--.
Column 8, line 25, "block" should read --beam--.
Column 11, line 16, "alignment" should read --aligning--.
Column 12, line 13, "an" should read --and--.
Column 5, line 38, "cneter" should read --center--.

Signed and Sealed this

Twenty-ninth Day of May, 1990

Attest:

HARRY F. MANBECK, JR.

*Attesting Officer*     *Commissioner of Patents and Trademarks*